US010907252B2

(12) United States Patent
Zhang et al.

(10) Patent No.: US 10,907,252 B2
(45) Date of Patent: Feb. 2, 2021

(54) HORIZONTAL HEAT CHOKE FACEPLATE DESIGN

(71) Applicant: Applied Materials, Inc., Santa Clara, CA (US)

(72) Inventors: Yuxing Zhang, Santa Clara, CA (US); Daniel Hwung, Los Gatos, CA (US); Ashutosh Agarwal, San Jose, CA (US); Kaushik Alayavalli, Sunnyvale, CA (US); Kalyanjit Ghosh, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 136 days.

(21) Appl. No.: 16/168,462

(22) Filed: Oct. 23, 2018

(65) Prior Publication Data

US 2019/0119816 A1   Apr. 25, 2019

Related U.S. Application Data

(60) Provisional application No. 62/575,765, filed on Oct. 23, 2017.

(51) Int. Cl.
*C23C 16/455* (2006.01)
*H01J 37/32* (2006.01)
*C23C 16/44* (2006.01)

(52) U.S. Cl.
CPC .... *C23C 16/45565* (2013.01); *C23C 16/4401* (2013.01); *C23C 16/4409* (2013.01); *C23C 16/4557* (2013.01); *C23C 16/45572* (2013.01); *H01J 37/3244* (2013.01)

(58) Field of Classification Search
None
See application file for complete search history.

(56) References Cited

U.S. PATENT DOCUMENTS

| | | | |
|---|---|---|---|
| 5,882,411 A * | 3/1999 | Zhao | C23C 16/45565 118/715 |
| 6,827,815 B2 | 12/2004 | Hytros et al. | |
| 2005/0000430 A1* | 1/2005 | Jang | C23C 16/45565 118/715 |
| 2009/0095220 A1 | 4/2009 | Meinhold et al. | |
| 2009/0095334 A1* | 4/2009 | Huston | H01J 37/3244 134/105 |
| 2011/0146571 A1 | 6/2011 | Bartlett et al. | |
| 2015/0007770 A1* | 1/2015 | Chandrasekharan | C23C 16/45572 118/715 |
| 2016/0343595 A1 | 11/2016 | Lind et al. | |
| 2019/0226088 A1* | 7/2019 | Zhang | C23C 16/45565 |

* cited by examiner

*Primary Examiner* — Binu Thomas
(74) *Attorney, Agent, or Firm* — Patterson + Sheridan LLP

(57) ABSTRACT

Embodiments herein relate to gas distribution apparatuses. In one aspect, the disclosure herein relates to a showerhead including a body having an upper surface and a lower surface. A thermal choke is disposed adjacent a perimeter of the body. The thermal choke includes a plurality of interleaved channels. One or more apertures are disposed between the upper surface and the lower surface of the body.

19 Claims, 3 Drawing Sheets

HORIZONTAL HEAT CHOKE FACEPLATE DESIGN

CROSS-REFERENCE TO RELATED APPLICATIONS

This application claims benefit of U.S. provisional patent application Ser. No. 62/575,765, filed Oct. 23, 2017, which is herein incorporated by reference in its entirety.

BACKGROUND

Field

Embodiments of the present disclosure generally relate to a gas distribution plate for use in substrate processing chambers.

Description of the Related Art

In the fabrication of integrated circuits, deposition processes such as chemical vapor deposition (CVD) or atomic layer deposition (ALD) are used to deposit films of various materials upon semiconductor substrates. In other operations, a layer altering process, such as etching, is used to expose a portion of a layer for further depositions. Often, these processes are used in a repetitive fashion to fabricate various layers of an electronic device, such as a semiconductor device.

Fabricating a defect free semiconductor device is desirable when assembling an integrated circuit. Contaminants or defects present in a substrate can cause manufacturing defects within the fabricated device. For example, contaminants present in the process gas or the process gas delivery system may be deposited on the substrate, causing defects and reliability issues in the semiconductor device fabricated thereon. Accordingly, it is desirable to form a defect-free film when performing a deposition process. However, with conventional deposition devices, the layered films may be formed with defects and contaminants.

Therefore, what is needed in the art are improved apparatus for film deposition.

SUMMARY

In one embodiment, a showerhead includes a body having an upper surface and a lower surface. Apertures are disposed within the body extending between the upper surface and the lower surface. A thermal choke is further disposed adjacent a perimeter of the body, the thermal choke comprising a plurality of interleaved channels.

In another embodiment, a showerhead includes a body having a flange extending therefrom. A thermal choke is disposed within the flange, the thermal choke comprising a plurality of channels. Apertures are disposed through the body at a location inwardly of the flange.

In another embodiment, a process chamber comprises a chamber body; a lid assembly coupled to the chamber body to define a process volume; a substrate support disposed in the process volume; and a showerhead disposed above the substrate support. The showerhead comprises a body having an upper surface and a lower surface; a thermal choke disposed adjacent a perimeter of the body, the thermal choke comprising a plurality of interleaved channels; and one or more apertures disposed between the upper surface and the lower surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein relate to gas distribution apparatuses. In one aspect, the disclosure herein relates to a showerhead having a plurality of apertures therethrough. A thermal choke is disposed with the showerhead surrounding the apertures to define a first zone and a second zone. A heater is disposed between the thermal choke and the apertures and is configured to heat the showerhead.

Figure 1:
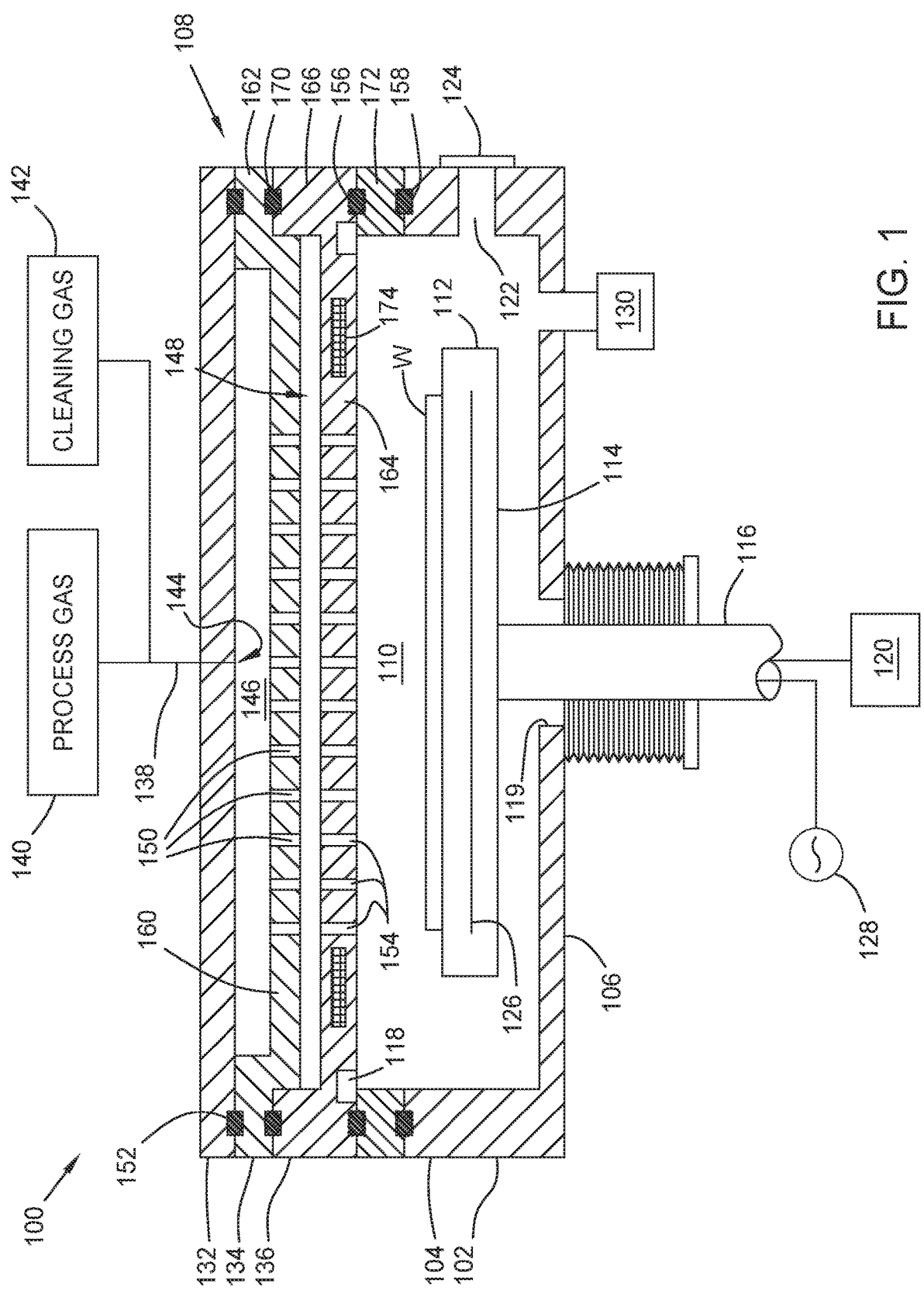
FIG. 1 illustrates a schematic cross-sectional view of a processing chamber according to one embodiment of the disclosure.

FIG. 1 illustrates a schematic cross-sectional view of a process chamber 100 according to one embodiment. The process chamber 100 includes a chamber body 102 having a sidewall 104 and a base 106. A lid assembly 108 couples to the chamber body 102 to define a process volume 110 therein. The chamber body 102 is formed from a metallic material, such as aluminum or stainless steel, but any material suitable for use with the process therein may be utilized. A substrate W is removably disposed on a substrate support 112 within the process volume 110. The substrate support 112 includes a support body 114 coupled to a shaft 116. The shaft 116 is coupled to the support body 114 and extends out of the process volume 110 through an opening 119 in the base 106. The shaft 116 is coupled to an actuator 120 configured to vertically actuate the shaft 116, and the support body 114 coupled thereto, between a substrate loading position and a processing position which is elevated from the loading position. A vacuum system 130 is coupled to the process volume 110 in order to evacuate gases from the process volume 110.

The substrate W is disposed on the support body 114 opposite of the shaft 116. The substrate W is loaded into the process volume 110 through a port 122 formed in the sidewall 104. A door 124, such as a slit valve, is actuated to selectively enable the substrate W to pass through the port 122 to be loaded onto or removed from the substrate support 112. An electrode 126 is optionally disposed within the support body 114 and coupled to a power source 128 through the shaft 116. The electrode 126 is selectively biased by the power source 128 to create an electromagnetic field to chuck the substrate W to the support body 114. In certain embodiments, a heater (not shown), such as a resistive heater, is disposed within the support body 114 to heat the substrate W disposed thereon.

The lid assembly 108 includes a lid 132, a blocker plate 134, and a showerhead 136. The blocker plate 134 includes a recessed circular distribution portion 160 surrounded by an annular extension 162. The blocker plate 134 is disposed between the lid 132 and the showerhead 136 and is coupled to the lid 132 and the showerhead 136 at the annular extension 162. The lid 132 couples to an upper surface of the annular extension 162 opposite the chamber body 102. The showerhead 136 couples to a lower surface of the annular extension 162. The blocker plate 134 is configured to define a first volume 146 between the blocker plate 134 and the lid 132. The blocker plate 134 further defines a second volume 148 between the blocker plate 134 and the showerhead 136. An array of apertures 150 are formed through the distribution portion 160 of the blocker plate 134 and enable fluid communication between the first volume 146 and the second volume 148.

The lid 132 defines the upper boundary of the first volume 146. An inlet port 144 is disposed within the lid 132. The lid 132 is coupled to a gas conduit 138. The gas conduit 138 enables a gas to flow from a first gas source 140, such as a process gas source, through the inlet port 144 into the first volume 146. A second gas source 142, such as a cleaning gas source, is optionally coupled to the gas conduit 138. In certain embodiments, a process gas, such as an etching gas, is supplied from the first gas source 140 in order to etch a layer on the substrate W. Then, a cleaning gas is supplied from the second gas source 142 in order to remove particle depositions on the chamber surfaces, such as surfaces of the sidewall 104 facing the process volume 110. In further embodiments, the lid 132 includes a remote plasma source (not shown) configured to create a plasma within the process volume 110, the first volume 146, or the second volume 148. A seal 152, such as an O-ring, is disposed between the blocker plate 134 and the lid 132 at the upper surface of the annular extension 162 surrounding the first volume 146. The seal 152 isolates the process volume 110 from the external environment which enables maintenance of a vacuum therein generated by the vacuum system 130.

An annular isolator 172 is disposed between the chamber body 102, specifically the sidewall 104, and the showerhead 136. A seal 156, such as an O-ring, is disposed between the isolator 172 and the showerhead 136. The seal 156 isolates the process volume 110 from the external environment and enables maintenance of a vacuum therein. The isolator 172 is fabricated from a thermally insulating material such as a ceramic material. The isolator 172 reduces heat transfer from the showerhead 136 to the chamber body 102. A second seal 158 is disposed between the isolator 172 and the chamber body 102. In certain embodiments, the seal 158 is an O-ring. In other embodiments, the seal 158 is a bonding material layer coupling the chamber body 102 and the isolator 172.

The showerhead 136 is disposed below the blocker plate 134 and the lid 132. More specifically, the showerhead 136 is disposed between the blocker plate 134 and the isolator 172. In one embodiment, the showerhead 136 is a circular-shaped body. In other embodiment, non-circular shapes, such as square or ovoid, are contemplated. The showerhead 136 is formed from a thermally conductive material. In one embodiment, the showerhead 136 is fabricated from a metallic material, such as aluminum, stainless steel, alloys thereof, and combinations thereof. Ceramic materials, such as aluminum nitride and aluminum oxide are also contemplated. In further embodiments, the showerhead 136 includes a dielectric material. Any material suitable to resist degradation due to processing temperatures may be utilized.

The showerhead 136 includes a distribution portion 164 and a coupling portion 166. The distribution portion 164 is disposed radially inward of the coupling portion 166 and between the process volume 110 and the second volume 148. The coupling portion 166 surrounds the distribution portion 164 at a periphery of the showerhead 136, and may be elevated above an upper surface of the distribution portion 164.

One or more apertures 154 are disposed through the showerhead 136 within the distribution portion 164. The apertures 154 enable fluid communication between the process volume 110 and the second volume 148. During operation, a gas is flows from the inlet port 144 into the first volume 146, through apertures 150 in the blocker plate 134, and into the second volume 148. From the second volume 148, the gas flows through the apertures 154 in the showerhead 136 into the process volume 110. The arrangement and sizing of the apertures 154 enables the selective flow of the gas into the process volume 110 to achieve a desired gas distribution. For example, a uniform distribution across the substrate W may be desired for certain processes.

One or more heaters 174 are disposed within the showerhead 136 in the distribution portion 164. In one embodiment, the heaters 174 are disposed radially outward of the apertures 154. The heaters 174 may be any device capable of providing heat to the showerhead 136. In certain embodiments, the heaters 174 include a resistive heater, and may be embedded within and encircling the apertures 154 of the showerhead 136. In further embodiments, the heaters 174 are a channel in fluid communication with a fluid source (not shown) that circulates a heated fluid therethrough. The heaters 174 heat the showerhead to a high temperature, for example, 300 degrees Fahrenheit and higher. It is believed that increasing the temperature of the showerhead 136 during processing, such as during a chemical vapor deposition process, results in significantly less contaminate particle deposition on the substrate W.

A thermal choke 118 is disposed within the showerhead 136 between the distribution portion 164 and the coupling portion 166. In one embodiment, the thermal choke 118 is disposed radially outward of the heaters 174. The thermal choke 118 minimizes the heat transfer between the distribution portion 164 and the coupling portion 166. Therefore, the distribution portion 164 and the coupling portion 166 may be maintained at different temperatures during processing.

The temperature differential across the thermal choke 118 may be 50 degrees Fahrenheit or higher. For example, the distribution portion 164 can be heated to about 350 degrees Fahrenheit by the heaters 174 while the coupling portion 166 is maintained at about 100 degrees Fahrenheit due to the presence of the thermal choke 118. The thermal choke 118 may be any device or mechanism that limits heat transfer between the distribution portion 164 and the coupling portion 166. In certain embodiments, the thermal choke 118 is an annular recess or gap defining a thin bridge between the coupling portion 166 and the distribution portion 164. In such an example, the annular recess or gaps may be continuous and form a circular or other shape of the perimeter of the showerhead. In further embodiments, the thermal choke 118 is a series of nested channels, spaced cooling fins, or the like.

A seal 170 is disposed between the showerhead 136 and the blocker plate 134 to enable maintenance of a vacuum within the process volume 110. Both seals 156, 170 are disposed adjacent to the coupling portion 166 of the showerhead 136 and radially outward from the thermal choke 118. In this configuration, the seals 156, 170 are O-rings formed from materials such as polytetrafluoroethylene (PTFE), rubber, or silicone. O-rings may be quickly repaired or replaced, for example, during a maintenance outage of the processing chamber, thereby greatly reducing maintenance time. Other seal designs, such as sheet gaskets or bonds, are also contemplated.

In conventional designs, a showerhead is not usually heated to the high temperatures described herein because the sealing materials degrade at elevated temperatures, such as 250 degrees Fahrenheit. However, the thermal choke 118 enables an inner portion of showerhead 136 (e.g. the distribution portion 164) in the process region 110 to be heated to elevated temperatures while an outer portion, adjacent to seals 156, 170, is maintained at a lower temperature. This facilitates a reduction in contaminant particle deposition on a substrate W being processed while also protecting the seals 156, 170 from degrading. Therefore, a seal is maintained around the process volume 110 while the showerhead 136 is heated to high temperatures.

Figure 2:
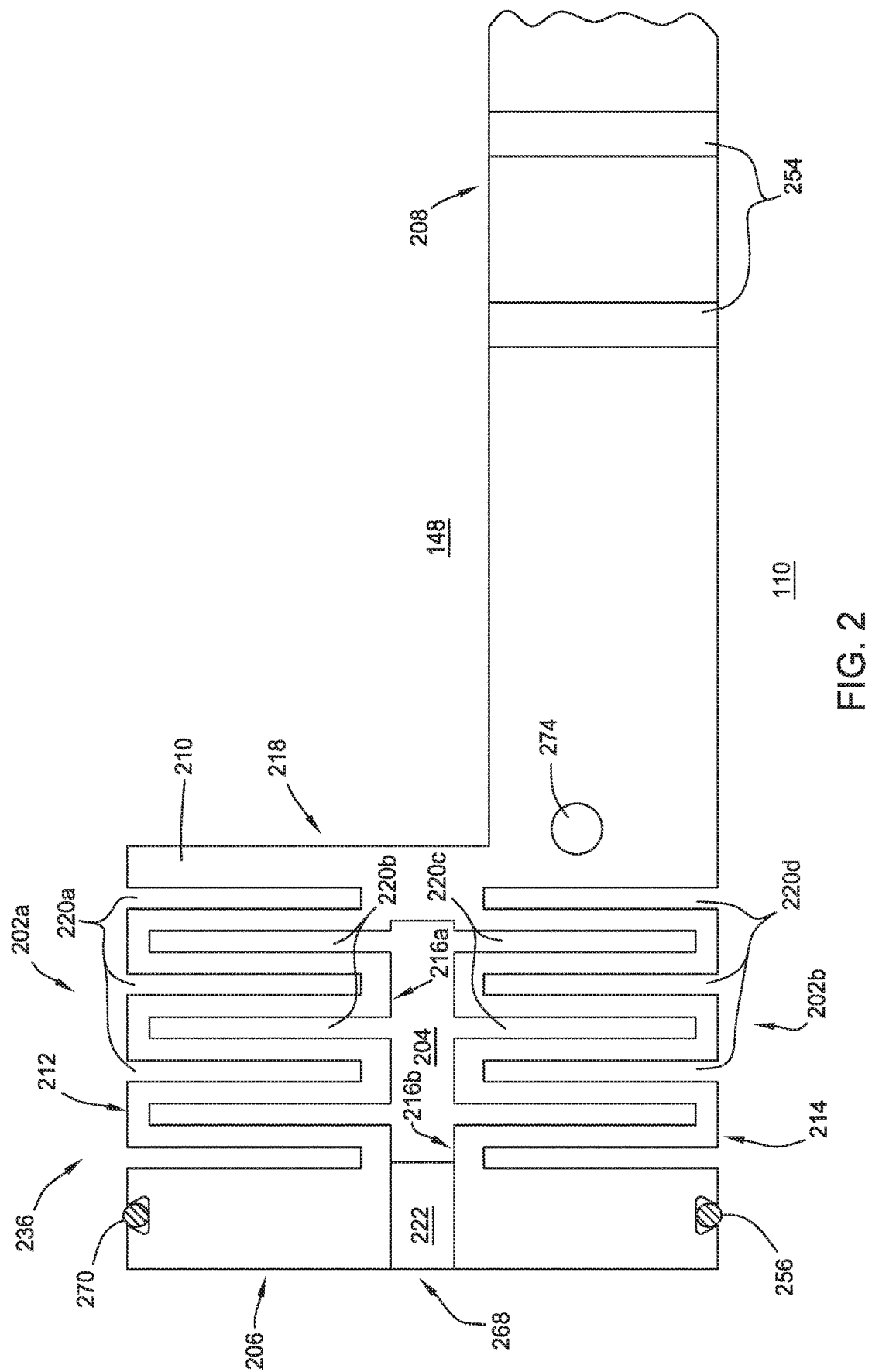
FIG. 2 illustrates a cross-sectional schematic arrangement of a dual choke showerhead according to one embodiment of the disclosure.

FIG. 2 illustrates a partial cross-section of a showerhead 236 according to one embodiment. The showerhead 236 is similar to the showerhead 136, but utilizes a dual thermal choke design. The showerhead 236 may be used in place of the showerhead 136 shown in FIG. 1. The showerhead 236 includes a circular body but other shapes, such as square or ovoid, are contemplated. In FIG. 2, an enlarged peripheral portion of the showerhead 236, including a thermal choke 268, is shown for clarity. The showerhead 236 includes the thermal choke 268 disposed radially outward of and surrounding a heater 274 and apertures 254. Here, two apertures 254 are illustrated, but it is understood that more apertures 254 are utilized. A circular distribution portion 208 defines the central region of the showerhead 236. At the periphery of the distribution portion 208, a flange 210 extends from and surrounds the distribution portion 208 and has an upper surface 212 and a lower surface 214. The upper surface 212 and the lower surface 214 are defined across the entire width of the flange 210 between a radially outward surface 206 and a radially inward surface 218.

The showerhead 236 is formed from a thermally conductive material. In some embodiments, the showerhead 236 is formed from a metallic material, for example, aluminum, stainless steel, or alloys thereof. In other embodiments, the showerhead 236 is formed from aluminum nitride or aluminum oxide. Any thermally conductive material may be used to form the showerhead 236.

The thermal choke 268 is formed in the flange 210 between the upper surface 212 and the lower surface 214. The thermal choke 268 is a dual choke and includes two groupings of interleaved annular channels 202a, 202b, which form a baffle or serpentine configuration. A slot 204 is disposed between the annular channels 202a, 202b and extends along the entire circumference of the showerhead 236. The slot 204 extends from the radially outward surface 206 of the showerhead 236 and partially extends through the flange 210. The slot 204 defines intermediate surfaces 216a, 216b within the flange 210. The first grouping of annular channels 202a includes channels 220a and 220b. The channels 220a extend vertically downward from the upper surface 212 towards the slot 204. The channels 220b extend vertically upward from the upper intermediate surface 216a towards the upper surface 214 of the flange 210. The channels 220b are disposed in an alternating fashion between adjacent channels 220a. In one example, the channels 220a-220d are formed perpendicular to the slot 204.

The second grouping of annular channels 202b, which include channels 220c and 22d, are fashioned in a similar manner to those of grouping 202a. The channels 220c extend vertically downward from the lower intermediate surface 216b toward the lower surface 214 of flange 210. The channels 220d extend vertically upward from the lower surface 214 towards the lower intermediate surface 216b. Similarly, channels 220c are disposed in an alternating fashion between channels 220d.

In one embodiment, for both groupings 202a, 202b, the channels 220a-220d may not span an entire width of a respective portion of the flange 210. That is, the channels 220a-220d define bridges between each channel end of the opposing surface. For example, channels 202a have a bridge between the ends thereof and the upper intermediate surface 216a. In this configuration, the channels 220a-220d, in cooperation with the slot 204, greatly increase the surface area for the expulsion of heat to the external environment around the showerhead 236. Additionally, the cross-sectional area and/or mass available to conduct heat from the deposition region 208 towards the outer surface is greatly reduced. Further, FIG. 2 illustrates seven channels 220a-d but any number and configuration thereof may be utilized.

A series of stands 222 are optionally disposed within the slot 204. In one embodiment, the stands 222 extend from the surface 222 radially inward into the slot 204. The stands 222 function to supplement the structural strength and rigidity in an area from which material is removed from the flange 210 (e.g., within the slot 204). The increased mechanical integrity and rigidity prevents or substantially reduces warping of the flange 210 and/or showerhead 236 due to thermal cycling. In some embodiments, the stands 222 include a number of discrete blocks disposed around the periphery of the showerhead 236 within the slot 204. In further embodiments, the stands 222 comprise a number of semi-arcuate members. In still further embodiments, the stands 222 are a single ring around the entire circumference of the showerhead 236. Any geometry of the stands 222 is contemplated in accordance with the embodiments described herein. The stands 222 are fabricated from a material having a relatively low thermal conductivity, such as a ceramic material, to minimize heat transfer between the intermediate surfaces 216a, 216b therethrough.

A seal 270 is disposed within a dovetailed groove in the upper surface 212. A seal 256 is similarly disposed within a dovetailed groove in the lower surface 214. The seals 270, 256 are disposed radially outward of the channels 220a-220d comprising the thermal choke 268. In this arrangement, heat transfer to the seals 270, 256 from the deposition portion 208 and the heater 274 disposed therein is reduced or mitigated. Therefore, the heater 274 may heat the deposition region 208, including surfaces of the apertures 254 therethough, while maintaining a different temperature in an area outside of the thermal choke 268, thus maintaining the seals 270, 256 in a temperature range which does not accelerate degradation of the seals 270, 256. In some embodiments, the seals 256, 270 are disposed directly on the surfaces 214, 212 respectively.

It is understood that the size, shape, and number of channels 220a-220d may be selected in relation to a desired rate of heat transfer across the thermal choke 268. Further, the depth, width, and cross section of the channels 220a-220d may be adjusted as desired. Still further, the orientation of the channels may be altered. For example, rather than vertical channels, the channels may be oriented horizontally between the outer surface 206 and the inner surface 218. Any arrangement of channels, gaps, grooves, recesses, or cutouts capable of minimizing heat transfer may be utilized.

Figure 3:
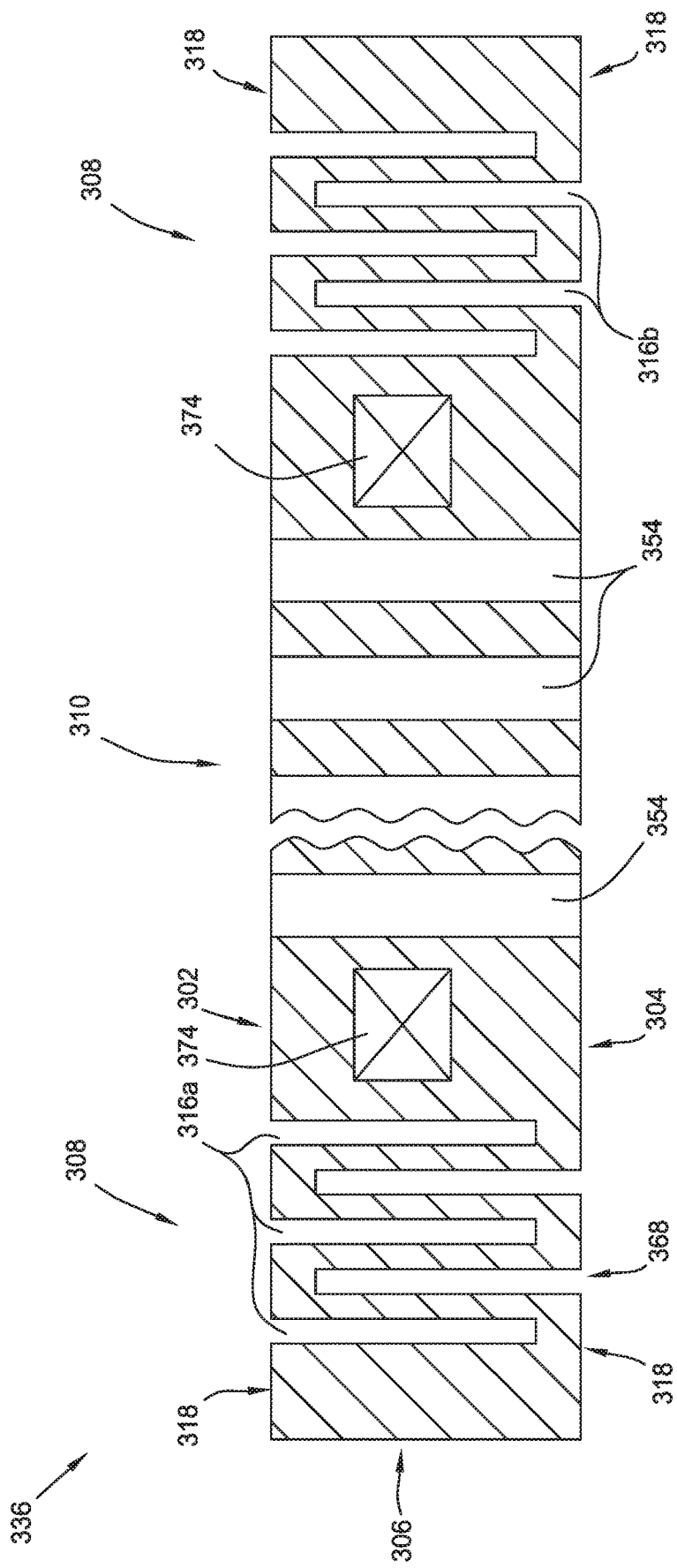
FIG. 3 illustrates a cross-sectional schematic arrangement of a showerhead according to one embodiment of the disclosure.

FIG. 3 illustrates a schematic cross-sectional view of a showerhead 336 having a single thermal choke 368. The showerhead 336 is similar to the showerhead 136 of FIG. 1 but has a flat body and a differing thermal choke. The showerhead 336 is defined by an upper surface 302, a lower surface 304, and an outer surface 306. An outer coupling portion 308 is disposed radially outward of and surrounds an inner distribution portion 310. One or more apertures 354 extending between the upper surface 302 and the lower surface 304 are disposed within the distribution portion 310. One or more heaters 374 are disposed within the showerhead 336 surrounding the apertures 354. In one embodiment, the heaters 374 are disposed radially outward of the apertures 354 and radially inward of the coupling portion 308.

The showerhead 336 includes a circular body formed from a thermally conductive material. However, other shapes, such as ovoid or rectangular, are contemplated. In some embodiments, the showerhead 336 is formed from a metallic material, for example, aluminum, stainless steel, or alloys thereof. In other embodiments, the showerhead 336 is formed from aluminum nitride or aluminum oxide. Any thermally conductive material may be used to form the showerhead 336.

A thermal choke 368 is disposed radially outward of and surrounding the inner distribution portion 310, and the thermal choke 368 partially defines the coupling portion 308. In the embodiment of FIG. 3, the thermal choke 368 includes interleaved channels 316a, 316b. Channels 316a extend vertically downward from the upper surface 302 towards the lower surface 304. Channels 316b, disposed between adjacent channels 316a, extend vertically upward from the lower surface 304 towards the upper surface 302. In FIG. 3, the channels 316a, 316b are annular channels. In other embodiments, the channels 316a, 316b are a series of partially annular, arcuate members. FIG. 3 illustrates five channels 316a, 316b. However, any number of channels may be utilized.

The channels 316a, 316b extend partially through the thickness of the showerhead 336 between the upper surface 302 and the lower surface 304. That is, a bridge is defined at the terminating end of each channel. For example, a bridge is defined between the end of channels 316a and the lower surface 304. The repeating bridges limit the cross-sectional area and/or mass for heat transfer from the deposition portion 310 towards the outer surface 306. As discussed previously, the size, shape, and number of channels 316a, 316b may be selected in relation to a desired rate of heat transfer across the thermal choke 368. Further, the depth, width, and cross section of the channels may be adjusted as desired. Still further, the orientation of the channels may be changed. For example, rather than vertical channels, the channels may be oriented horizontally. Any arrangement of channels, gaps, grooves, recesses, or cutouts capable of minimizing heat transfer may be utilized.

Sealing surfaces 318 are disposed radially outward from the thermal choke 368 towards the outer surface 306. The sealing surfaces 318 define contact areas for seals, such as O-rings, thereon. In some embodiments, the seals (not shown) are disposed within mating bodies, such as the isolator 172 (FIG. 1) and the blocker plate 134 (FIG. 1), and contact or seal against the sealing surfaces 318. In further embodiments, the seals are disposed within grooves (not shown) in the sealing surfaces 318. The thermal choke 368 limits the transfer of heat from the distribution portion 310 towards the outer surface 306, thus enabling the inner distribution portion 310 to have an increased temperature provided by the heater 374 while the sealing surfaces 318 are maintained at a lower temperature. Any method of seal, for example bonding layers or sheet gaskets, may be utilized herewith.

The embodiments described herein advantageously reduce the deposition of contaminant particles on a substrate. The thermal choke as disclosed enables the temperature of the showerhead to be increased to a high temperature, limiting the deposition of contaminant particles, while maintaining the sealing capabilities of the seals.

While the foregoing is directed to embodiments of the present disclosure, other and further embodiments of the disclosure may be devised without departing from the basic scope thereof, and the scope thereof is determined by the claims that follow.

What is claimed is:

1. A process chamber, comprising:
a chamber body;
a lid assembly coupled to the chamber body to define a process volume;
a substrate support disposed in the process volume; and
a showerhead disposed above the substrate support, the showerhead comprising:
a body having an upper surface and a lower surface;
a thermal choke disposed adjacent a perimeter of the body, the thermal choke comprising:
a slot extending in a first direction;
a series of stands disposed within the slot; and
two groupings comprising a plurality of interleaved channels, wherein the two groupings are separated by the slot in a second direction perpendicular to the first direction; and
one or more apertures disposed between the upper surface and the lower surface, the one or more apertures extending in the first direction.

2. The process chamber of claim 1, wherein the showerhead comprises aluminum.

3. The process chamber of claim 2, further comprising a heater disposed within the showerhead.

4. A showerhead, comprising:
a body having an upper surface and a lower surface;
a thermal choke disposed adjacent a perimeter of the body, the thermal choke comprising:
a slot extending in a first direction;
a series of stands disposed within the slot; and
two groupings comprising a plurality of interleaved channels, wherein the two groupings are separated by the slot in a second direction perpendicular to the first direction; and
one or more apertures disposed between the upper surface and the lower surface, the one or more apertures extending in the first direction.

5. The showerhead of claim 4, wherein the series of stands extends from a surface of the body.

6. The showerhead of claim 4, wherein the series of stands comprise one or more discrete blocks.

7. The showerhead of claim 4, wherein the series of stands comprise one or more of semi-arcuate members.

8. The showerhead of claim 4, wherein each stand of the series of stands are a single ring around a circumference of the showerhead.

9. The showerhead of claim 4, further comprising:
a first dovetailed groove formed in the upper surface; and
a first seal disposed in the first dovetailed groove.

10. The showerhead of claim 9, further comprising:

a second dovetailed groove formed in the lower surface; and a second seal disposed in the second dovetailed groove.

11. The showerhead of claim 10, wherein the first seal and the second seal are disposed radially outward of the two groupings.

12. The showerhead of claim 4, wherein the interleaved channels extend in the first direction.

13. The showerhead of claim 4, wherein:
each interleaved channel of the plurality of interleaved channels is a cutout, and
each cutout extends partially through the body.

14. The showerhead of claim 4, further comprising a heater disposed within the body.

15. The showerhead of claim 14, wherein the heater is disposed between the plurality of interleaved channels and the one or more apertures.

16. The showerhead of claim 14, wherein the heater is a resistive heater.

17. The showerhead of claim 14, wherein the heater includes a channel for receiving a fluid therein.

18. The showerhead of claim 4, wherein the body is cylindrical.

19. The showerhead of claim 4, wherein the plurality of interleaved channels extend in the second direction.

* * * * *